(12) United States Patent
Ryu et al.

(10) Patent No.: US 7,714,638 B2
(45) Date of Patent: May 11, 2010

(54) EASED GATE VOLTAGE RESTRICTION VIA BODY-BIAS VOLTAGE GOVERNOR

(75) Inventors: Hyukju Ryu, Seoul (KR); Heesung Kang, Gyeonggi-Do (KR); Kyungsoo Kim, Gyeonggi-Do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/987,969

(22) Filed: Dec. 6, 2007

(65) Prior Publication Data
US 2008/0088359 A1 Apr. 17, 2008

Related U.S. Application Data

(63) Continuation of application No. 10/989,367, filed on Nov. 17, 2004, now Pat. No. 7,332,954.

(30) Foreign Application Priority Data

Jan. 27, 2004 (KR) .......................... 2004-0004947

(51) Int. Cl.
*H01L 27/01* (2006.01)
(52) U.S. Cl. .................. 327/537; 327/534; 327/530; 326/34
(58) Field of Classification Search .......... 327/530, 327/534, 427, 535, 537; 326/217, 402, 33, 326/34
See application file for complete search history.

(56) References Cited

U.S. PATENT DOCUMENTS

| 5,317,282 | A |   | 5/1994  | Quast ......................... 330/277 |
|-----------|---|---|---------|----------------------------------------|
| 5,559,368 | A | * | 9/1996  | Hu et al. ...................... 257/369 |
| 5,594,371 | A | * | 1/1997  | Douseki ...................... 326/119 |
| 5,748,016 | A |   | 5/1998  | Kurosawa |
| 5,821,769 | A |   | 10/1998 | Douseki ...................... 326/34 |
| 5,959,488 | A |   | 9/1999  | Lin et al. ...................... 327/313 |
| 6,118,328 | A | * | 9/2000  | Morikawa ................... 327/534 |
| 6,121,665 | A |   | 9/2000  | Gonzalez |
| 6,225,846 | B1 |  | 5/2001  | Wada et al. |

(Continued)

FOREIGN PATENT DOCUMENTS

DE    197 38 714    3/1999

(Continued)

OTHER PUBLICATIONS

James T. Kao et al., "Dual-Threshold Voltage Techniques for Low-Power Digital Circuits," IEEE Journal of Solid-State Circuits, vol. 35, No. 7, Jul. 2000 (available at: http://www.mtl.mit.edu/research/icsystems/pubs/journals/2000_kao_issc.pdf).

(Continued)

*Primary Examiner*—Dinh T. Le
(74) *Attorney, Agent, or Firm*—Harness, Dickey & Pierce, P.L.C.

(57) ABSTRACT

An arrangement, to ease restriction upon gate voltage (Vgg) magnitudes for a dynamic threshold MOS (DTMOS) transistor, may include: an MOS transistor including a gate and a body; and a body-bias-voltage (Vbb) governor (Vbb-governor) circuit to provide a governed version of Vgg of the MOS transistor to the body of the MOS transistor as a dynamic body bias-voltage (Vbb).

9 Claims, 6 Drawing Sheets

U.S. PATENT DOCUMENTS

| | | | |
|---|---|---|---|
| 6,225,852 B1 | 5/2001 | Cleveland et al. | |
| 6,433,620 B1 | 8/2002 | Mashiko et al. | |
| 6,465,849 B1 | 10/2002 | Chang et al. | 257/369 |
| 6,469,568 B2 | 10/2002 | Toyoyama et al. | |
| 6,624,687 B1 * | 9/2003 | Burr | 327/546 |
| 6,628,159 B2 | 9/2003 | Voldman | 327/534 |
| 6,661,277 B2 | 12/2003 | Dabral | 327/534 |
| 6,864,708 B2 * | 3/2005 | Takahashi et al. | 326/33 |
| 6,958,519 B2 | 10/2005 | Gonzalez et al. | 257/402 |

FOREIGN PATENT DOCUMENTS

| | | |
|---|---|---|
| DE | 102 00 859 | 7/2002 |
| JP | 2-148907 | 6/1990 |

OTHER PUBLICATIONS

Sung-Mo Kang, "Elements of Low Power Design for Integrated Systems," UCSC, Baskin School of Engineering, Proceedings of the 2003 Int'l Symposium on Low Power Electronics and Design, pp. 205-210, published by ACM, New York, NY, 2003.
http://www.mtl.mit.edu/research/icsystems/pubs/tutorials/isscc97_slides1.pdf.
http://www.ece.pdx.edu/~song/IC/Low-4.pdf.
British Patent Office Action dated Apr. 29, 2005.
Korean Office Action dated Nov. 29, 2005.
German Office Action dated Apr. 23, 2009.

\* cited by examiner

US 7,714,638 B2

EASED GATE VOLTAGE RESTRICTION VIA BODY-BIAS VOLTAGE GOVERNOR

PRIORITY STATEMENT

This application is a continuation of, and claims priority under 35 U.S.C. §120 to, U.S. patent application Ser. No. 10/989,367 filed on Nov. 17, 2004 now U.S. Pat. No. 7,332,954, which claims priority under 35 U.S.C. §119 to Korean Patent Application No. 2004-0004947 filed on Jan. 27, 2004 in the Korean Intellectual Property Office. The entire contents of both of these applications are incorporated herein by reference.

BACKGROUND OF THE PRESENT INVENTION

Low threshold transistor logic, e.g., CMOS, is desirable because it facilitates reducing the footprint of circuits, requires a smaller power supply capability, etc. But low threshold voltage logic suffers substantial leakage current during a non-active mode that can, e.g., negate the benefit of the reduced power consumption during an active mode.

The Background Art addressed the leakage problem with a multi-threshold MOS (MTMOS) architecture, e.g., MTCMOS-type, that serially couples a sleep transistor and a low threshold logic. circuit between a system-supply voltage (VDD) and a system-ground voltage (VSS). The sleep transistor has a high threshold voltage and so exhibits low leakage current in a sleep mode, but which is slower to switch to the active mode than a comparable low-threshold transistor. As its name suggests, the sleep transistor reduces the non-active mode current of the low-threshold device because it serially connects the low-threshold logic to VSS. The sleep transistor imposes little in the way of a switching-speed penalty because it is always on during the active mode of the low-threshold logic.

High threshold voltages are typically achieved by applying a body bias voltage (Vbb) to the sleep transistor. The requisite Vbb generator circuitry increases the foot print of the overall device. Also, the high threshold of the sleep transistor requires a larger channel size to obtain comparable current capability, which also increases the overall footprint.

The Background Art addressed the footprint problem associated with the Vbb generator circuitry by using a dynamic threshold MOS (DTMOS) transistor as the sleep transistor. In a DTMOS transistor, the gate is connected to the well (or, in other words, the transistor body), which forward biases the source/body junction. This eliminates the need for a separate Vbb generator circuit. As the gate voltage (Vgg) is used to bias the body, the threshold voltage varies with (or, in other words, is dynamic in proportion to) changes in the gate voltage.

Sub-threshold voltage leakage of a DTMOS transistor is generally low. But a high gate voltage which is also applied as Vbb can, in effect, forward bias one of the gate junctions (analogous to forward-biasing a diode) in the transistor and cause a forward-biased-diode-type leakage current. This is generally depicted in the circuit diagram of Background Art FIG. 3.

In Background Art FIG. 3, a leakage current path 302 is depicted. There the source, gate and body of a transistor 308 are connected to voltage VDD, which raises a node 304 is raised to voltage VDD. This has the effect of raising Vgg and thus Vbb for an NMOS transistor 306 to be about VDD, which forward biases the gate-source junction in NMOS transistor 306 and causes leakage.

Such junction forward-biasing can be solved by limiting Vgg to about 0.6 volts, which in Background Art FIG. 3 necessarily limits VDD to about 0.6 volts.

SUMMARY OF THE PRESENT INVENTION

At least one embodiment of the present invention provides an arrangement to ease restriction upon gate voltage (Vgg) magnitudes for a dynamic threshold MOS (DTMOS) transistor. Such an arrangement may include: an MOS transistor including a gate and a body; and a body-bias-voltage (Vbb) governor (Vbb-governor) circuit to provide a governed version of Vgg of the MOS transistor to the body of the MOS transistor as a dynamic body bias-voltage (Vbb).

Additional features and advantages of the invention will be more fully apparent from the following detailed description of example embodiments, the accompanying drawings and the associated claims.

Figure 3:
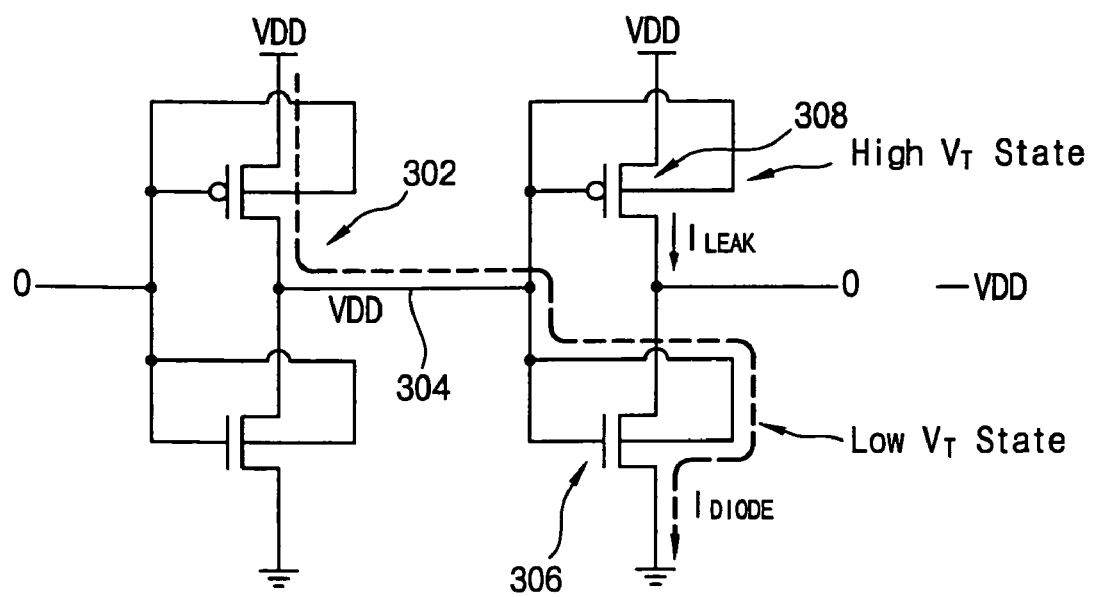
FIG. 3 is a circuit diagram illustrating a leakage-current problem for a DTMOS transistor circuit according to the Background Art.

Excluding FIG. 3, the drawings are: intended to depict example embodiments of the present invention and should not be interpreted to limit the scope thereof. Relative proportion in the drawings may be reduced or exaggerated for clarity. In other words, the drawings are not to scale.

DETAILED DESCRIPTION OF EXAMPLE EMBODIMENTS

In developing the present invention, the following problem with the Background Art was recognized and a path to a solution identified. The Background Art prevents unwanted forward biasing of one of the gate junctions in a DTMOS (again, dynamic threshold MOS) transistor by placing a limit on the magnitude of VDD (again, the system-supply voltage), and consequently on the magnitude of Vgg (again, the gate voltage). This is a simplistic solution that can at least frustrate, if not preclude, the use of one or more DTMOS transistors in circuits for which values of VDD and/or Vgg above a threshold voltage of the DTMOS transistor (e.g., about 0.6 volts, assuming that the DTMOS transistor is N-type) can (desirably) be present, which is a problem. An arrangement to impose an upper bound on the magnitude of Vbb, e.g., $Vbb \leq V_{sleep}^{threshold}$, would ease restrictions upon VDD and/ or Vgg, and thus solve the problem mentioned above. At least one embodiment of the present invention provides such an arrangement.

Figure 1A:
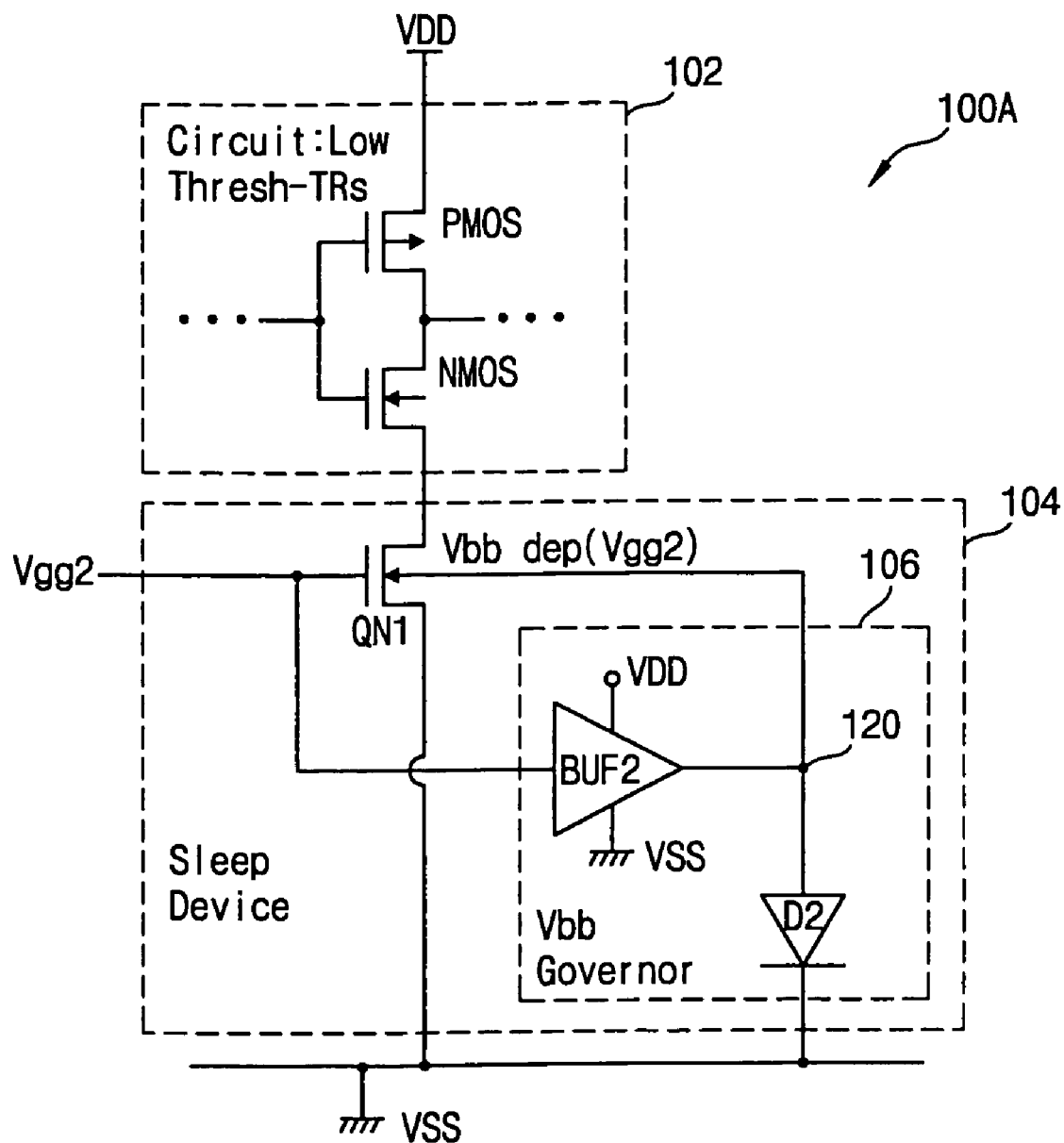
FIG. 1A illustrates a block diagram of an sleep device to ease restriction upon gate voltage for a DTMOS transistor, according to at least one embodiment of the present invention, the sleep device being incorporated into an MTMOS (again, multi-threshold MOS), e.g., MTCMOS, architecture according to at least one other embodiment of the present invention.

FIG. 1A illustrates a block diagram of sleep device 104 to ease restriction upon gate voltage for a DTMOS transistor, according to at least one embodiment of the present invention, sleep device 104 being incorporated into an MTMOS (again, multi-threshold MOS), e.g., MTCMOS, architecture 100A according to at least one other embodiment of the present invention.

In FIG. 1A, architecture 100A includes: a circuit 102 that includes low threshold transistors (hereafter, LT-circuit 102); and sleep device 104 (discussed in more detail below). LT-circuit 102 can be, e.g., a CMOS circuit including one or more low-threshold PMOS and one or more low-threshold NMOS transistors. Alternatively, LT-circuit 102 can be formed solely of PMOS transistors or solely of NMOS transistors. A great many circuits can correspond to circuit 102, hence very little detail about the internal construction of LT-circuit 102 is provided.

In architecture 100A, LT-circuit 102 and sleep device 104 are serially connected between VDD (again, system-supply voltage) and VSS (again, system-ground voltage). More particularly, LT-circuit 102 is connected between VDD and sleep device 104. And sleep device 104 is connected between LT-circuit 102 and VSS.

Sleep device 104 includes: a DTMOS (again, dynamic threshold MOS) transistor QN1, e.g., of NMOS fabrication; and a body-bias-voltage (again, Vbb) governor (hereafter Vbb-governor) circuit 106 to provide a dynamic body-bias voltage (Vbb) to the body of DTMOS transistor QN1.

Vbb-governor circuit 106 is arranged as a voltage divider that includes a first part and a second part coupled at a node 120. The voltage on node 120 is provided to transistor QN1 as its Vbb. The first part can be, e.g., a buffer circuit BUF2 that couples Vgg of transistor QN1 to node 120. Additionally, buffer circuit BUF2 also can be coupled between VDD and VSS. The second part can be, e.g., a diode D2 that couples node 120 to VSS. Diode D2 can be, e.g., a PMOS transistor whose gate and drain are connected to VSS and whose source is connected to node 120 (discussed further below), a PN junction connected between node 120 and VSS, a Schottky barrier connected between node 120 and VSS, etc.

While transistor QN1 is considered a DTMOS transistor because Vbb is a function of Vgg, sleep device 104 differs from the Background Art because Vbb is not merely Vgg connected substantially directly to the body of transistor QN1. Instead, Vbb is a governed version of Vgg. A governed version of a signal has had at least one of an upper and a lower bound imposed upon it, which is analogous to a clipped signal albeit without the connotation of noise associated with saturation-induced clipping. In other words, Vbb can be dependent, e.g., non-linearly dependent, upon Vgg. Here, the terms "governor, "governed," etc. are to be understood in a context that is analogous to the term "governor" in the automotive art. There, a governor is a device that automatically prevents the speed or position of some part (e.g., engine speed, transmission speed, etc) from exceeding a maximum desired value.

Here, Vbb-governor circuit 106 is operable to impose a bound (e.g., here an upper bound because transistor QN1 is N-type) on the magnitude of Vbb ($|Vbb|_{bound}$) such that a there can be a non-negligible difference Δ between a corresponding bound of Vgg (e.g., here, an upper bound because transistor QN1 is N-type, $|Vgg|_{bound}=|Vgg|_{max}$) and $|Vbb|_{max}$, $$\Delta = ||Vgg|_{max} - |Vbb|_{max}|. \quad 1)$$

And further because transistor QN1 is N-type, $$|Vbb|_{max} \leq |Vgg|_{max}. \quad 2)$$

Difference Δ (also referred to as the "Vgg margin") is greater than or equal to a threshold (or, in other words, turn-on) voltage of diode D2, $$\Delta \geq V_{D2}^{thresh}. \quad 3)$$

For example, $|Vgg|_{bound}=|Vgg|_{max} \leq 1.2$ volts while $|Vbb|_{max} \approx 0.6$ volts.

The operation of Vbb-governor circuit 106, in an active mode, can be described according to the following relation.

$$|Vbb|_{max} \approx \begin{cases} Vgg, & \text{for } VSS \leq Vgg \leq V_{D2}^{threshold} \\ V_{D2}^{threshold}, & \text{for } V_{D2}^{threshold} < Vgg \end{cases} \quad 4)$$

An effect of the operation of Vbb-governor circuit 106 is to substantially stabilize Vbb against fluctuations in Vgg.

Figure 1B:
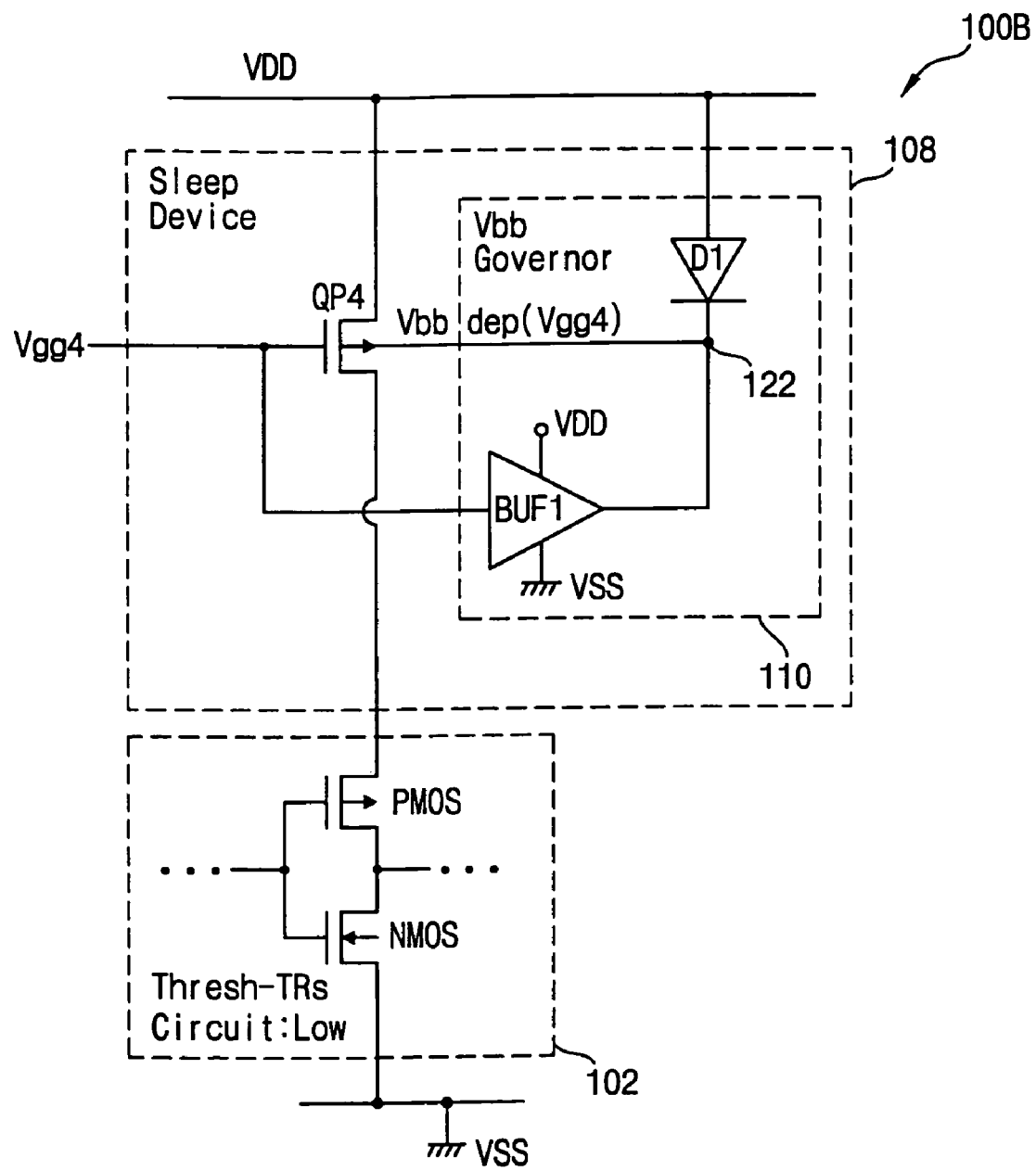
FIG. 1B illustrates a block diagram of another sleep device to ease restriction upon gate voltage for a DTMOS transistor, according to at least one other embodiment of the present invention, this sleep device being incorporated into an MTMOS architecture according to at least one other embodiment of the present invention.

FIG. 1B illustrates a block diagram of another sleep device 108 to ease restriction upon gate voltage for a DTMOS transistor, according to at least one other embodiment of the present invention, where sleep device 108 is incorporated into an MTMOS architecture 100B according to at least one other embodiment of the present invention.

In FIG. 1B, architecture 100B includes: circuit 102; and sleep device 108 (discussed in more detail below). In architecture 100B, LT-circuit 102 and sleep device 108 are serially connected between VDD and VSS. More particularly, sleep device 108 is connected between VDD and LT-circuit 102. And LT-circuit 102 is connected between sleep device 104 and VSS.

Sleep device 104 includes: a DTMOS transistor QP4, e.g., of PMOS fabrication; and a Vbb-governor circuit 110 to provide a dynamic Vbb to the body of transistor QP4. Vbb-governor circuit 110 is similar to Vbb-governor circuit 104 of FIG. 1A.

Vbb-governor circuit 110 is arranged as a voltage divider that includes a first part and a second part coupled at a node 122. The voltage on node 122 is provided to transistor QP4 as its Vbb. The first part can be, e.g., a buffer circuit BUF1 that couples Vgg of transistor QP4 to node 122. Additionally, buffer circuit BUF1 also can be coupled between VDD and VSS. The second part can be, e.g., a diode D1 that couples node 122 to VDD. Diode D1 can be, e.g., an NMOS transistor whose gate and drain are connected to VDD and whose source is connected to node 122 (discussed further below), a PN junction connected between VDD and node 122, a Schottky barrier connected between VDD and node 122, etc.

While transistor QP4 is considered a DTMOS transistor because Vbb is a function of Vgg, sleep device 108 differs from the Background Art because Vbb is not merely Vgg connected substantially directly to the body of transistor QP4. Instead, Vbb is a governed version of Vgg. In other words, again, Vbb can be dependent, e.g., non-linearly dependent, upon Vgg. Vbb-governor circuit 110 is operable to impose a bound (e.g., here a minimum bound because transistor QP4 is P-type, $|Vbb|_{bound}=|Vbb|_{min}$) such that there can be (as with Vbb-governor circuit 104) the non-negligible difference Δ between the corresponding value of Vgg (e.g., here, a minimum value because transistor QP4 is P-type) $|Vgg|_{bound}=|Vgg|_{min}$ and $|Vbb|_{min}$. Further, because transistor QP4 is P-type, $$|Vgg|_{min} \leq |Vbb|_{min}. \quad\quad\quad 5)$$

For example, $|Vgg|_{bound}=|Vgg|_{min}\approx 0$ volts while $|Vbb|_{min}\approx Vdd-V_{D1}^{threshold}$.

The operation of Vbb-governor circuit 110, in an active mode, can be described according to the following relation.

$$|Vbb|_{min} \approx \quad\quad\quad 6)$$
$$\begin{cases} Vgg, & \text{for } (VDD - V_{D1}^{threshold}) \leq Vgg \leq \approx VDD \\ VDD - V_{D1}^{threshold}, & \text{for } Vgg < VDD - V_{D1}^{threshold} \end{cases}$$

An effect of the operation of Vbb-governor circuit 110 (as with Vbb-governor circuit 106) is to substantially stabilize Vbb against fluctuations in Vgg.

Figure 1C:
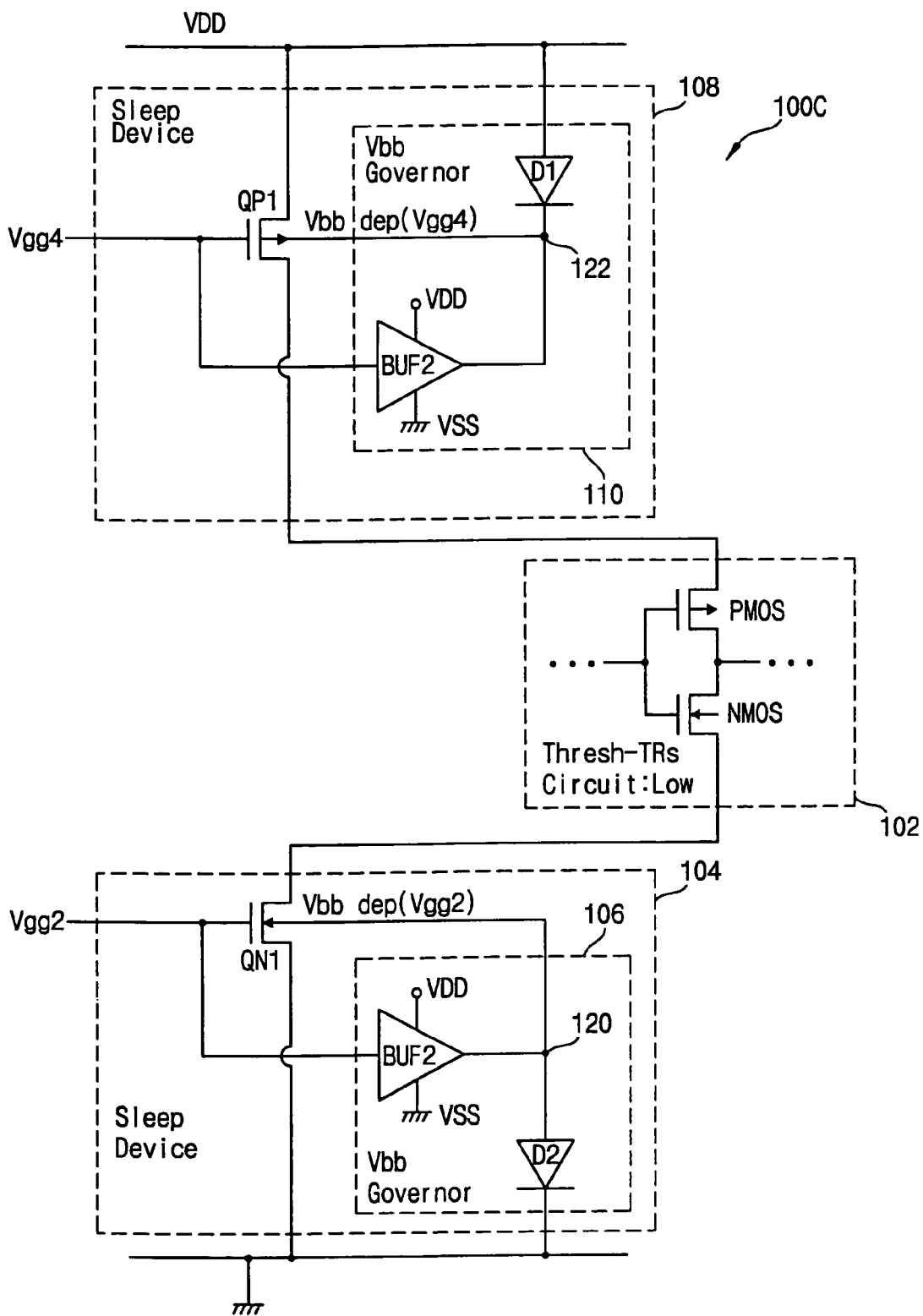
FIG. 1C illustrates a block diagram of another MTMOS architecture that is a combination of the MTMOS architectures of FIGS. 1A and 1B, according to at least one other embodiment of the present invention.

FIG. 1C illustrates a block diagram of another MTMOS architecture 100C that is a combination of the MTMOS architectures 100A of FIG. 1A and 100B of 1B, according to at least one other embodiment of the present invention.

Architecture 100C includes a serial connection of LT-circuit 102 and both of sleep devices 104 and 108 between VDD and VSS. More particularly, sleep device 104 is connected between LT-circuit 102 and VSS. And sleep device 108 is connected between VDD and LT-circuit 102. Further description of architecture 100C would be repetitive of that presented above and is omitted for the sake of brevity.

Figure 2A:
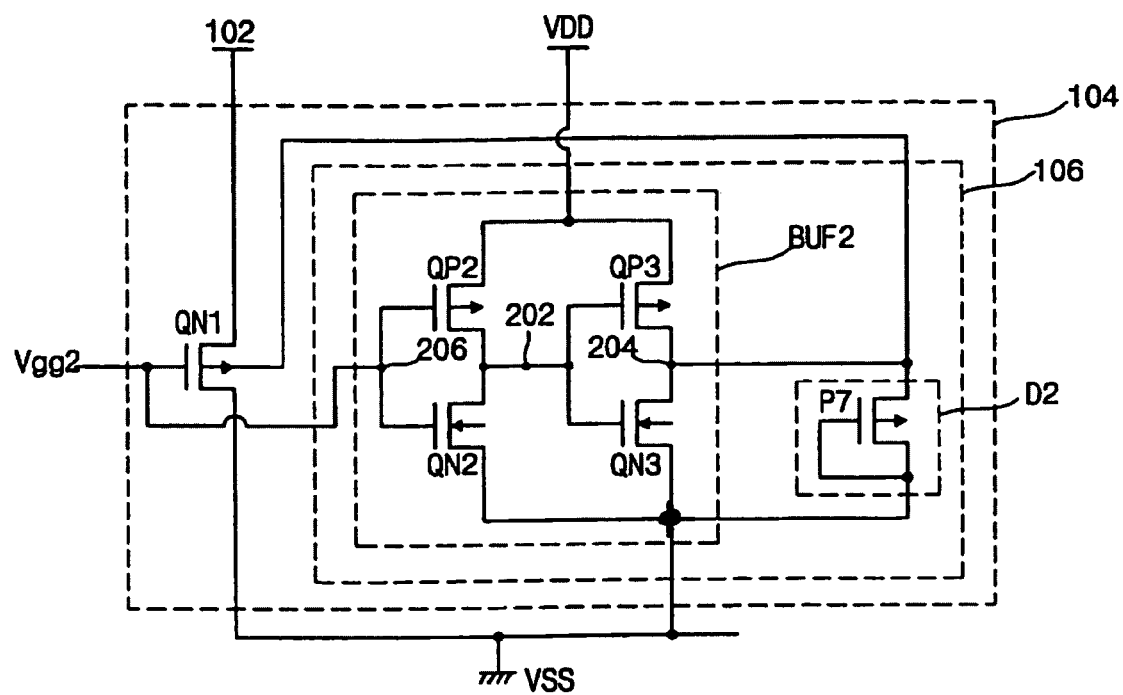
FIG. 2A is a circuit diagram of an example implementation of the sleep device in FIG. 1A (again, for easing restriction upon gate voltage for a DTMOS transistor), according to at least one other embodiment of the present invention.

FIG. 2A is a circuit diagram of an example implementation of sleep device 104 in FIG. 1A (again, for easing restriction upon gate voltage for DTMOS transistor QN1), according to at least one other embodiment of the present invention.

In FIG. 2A, buffer circuit BUF2 includes a pair of inverters connected between VDD and VSS. More particularly, the first inverter can be a pair of serially-connected transistors, e.g., a PMOS transistor QP2 and an NMOS transistor QN2. Similarly, the second inverter can be another pair of serially-connected transistors, e.g., a PMOS transistor QP3 and an NMOS transistor QN3.

The source of transistor QP2 can be connected to VDD and its drain connected to the drain of transistor QN2 at a node 202. The source of transistor QN2 can be connected to VSS. The gates of transistors QP3 and QN3 also can be connected to node 202. The source of transistor QP3 can be connected to VDD and its drain connected to the drain of transistor QN3 at a node 204. The source of transistor QN3 can be connected to VSS. Node 204 is connected as Vbb for DTMOS transistor QN1. Hence, node 204 corresponds to node 120 of FIG. 1A. The gates of transistors QP2 and QN2 can be connected together at a node 206, which can be connected to the gate of DTMOS transistor QN1.

Diode D2 is connected between node 204 and VSS. More particularly, diode D2 in FIG. 2A is depicted as a PMOS transistor P7 whose source is connected to node 204 and whose gate and drain are connected to VSS.

The operation of the circuitry of FIG. 2A will now be discussed.

In an active mode, namely when Vgg2 for DTMOS transistor QN1 is raised above $V_{QN1}^{threshold}$, then so is the voltage on node 206, which causes transistor QP2 to turn-off and transistor QN2 to turn-on. As a result, the voltage on node 202 is reduced to about VSS. This causes transistor QN3 to turn-off and transistor QP3 to turn-on, which initially raises the voltage on node 204 in proportion to increases in Vgg2 (starting at $V_{gg}\approx VSS$). The clipping effect of diode-configured transistor P7, however, places an upper bound on the voltage at node 204 as follows $$V_{node204} \approx VSS + V_{P7}^{threshold} \quad\quad\quad 7)$$

while transistor QP3 is on and transistor QN3 is off. As such, Vbb is no longer effected by the degree to which Vgg2 is raised above $V_{P7}^{threshold} = V_{D2}^{threshold}$. If VSS=0, then $$V_{node204} V_{QN1}^{bb} \approx V_{P7}^{threshold}. \quad\quad\quad 8)$$

In a non-active or sleep mode, namely when Vgg2 for DTMOS transistor QN1 is set low, e.g., $Vgg_2 \approx VSS$, then so is the voltage on node 206, which causes transistor QP2 to turn-on and transistor QN2 to turn-off. As a result, the voltage on node 202 is raised to $$V_{node202} \approx VDD - V_{QP2}^{threshold}g \quad\quad\quad 9)$$

This causes transistor QN3 to turn-on and transistor QP3 to turn-off, which reduces the voltage on node 204 to about VSS, namely $$V_{node204} \approx VSS + V_{QN3}^{threshold}g \quad\quad\quad 10)$$

Figure 2B:
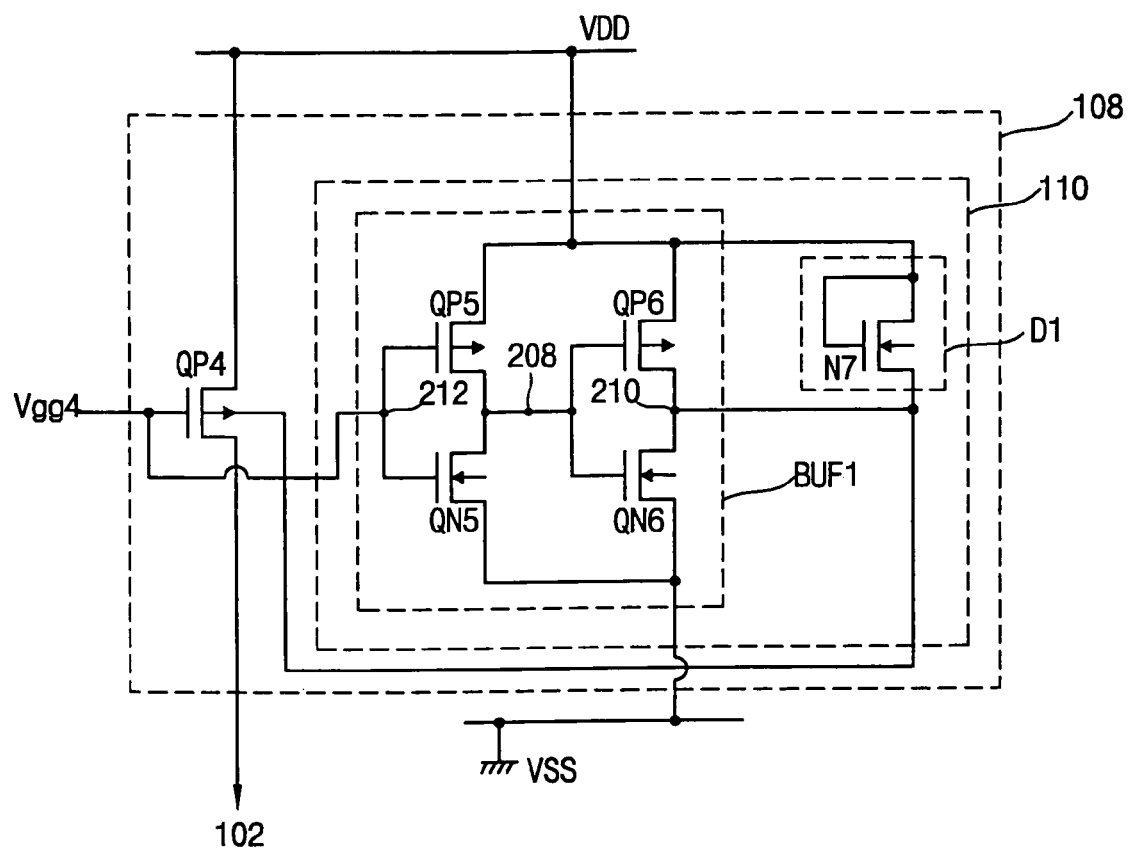
FIG. 2B is a circuit diagram of an example implementation of the sleep device in FIG. 1B (again, for easing restriction upon gate voltage for a DTMOS transistor), according to at least one other embodiment of the present invention.

FIG. 2B is a circuit diagram of an example implementation of sleep device 108 in FIG. 1B (again, for easing restriction upon gate voltage for DTMOS transistor QP4), according to at least one other embodiment of the present invention.

In FIG. 2B, buffer circuit BUF1 includes a pair of inverters connected between VDD and VSS. More particularly, the first inverter can be a pair of serially-connected transistors, e.g., an NMOS transistor QN5 and a PMOS transistor QP5. Similarly, the second inverter can be another pair of serially-connected transistors, e.g., a PMOS transistor QP6 and an NMOS transistor QN6.

The source of transistor QP5 can be connected to VDD and its drain connected to the drain of transistor QN5 at a node 208. The source of transistor QN5 can be connected to VSS. The gates of transistors QP6 and QN6 also can be connected to node 208. The source of transistor QP6 can be connected to VDD and its drain connected to the drain of transistor QN6 at a node 210. The source of transistor QN6 can be connected to VSS. Node 210 is connected as Vbb for DTMOS transistor QP4. Hence, node 210 corresponds to node 122 of FIG. 1A. The gates of transistors QN5 and QP5 can be connected together at a node 212, which can be connected to the gate of DTMOS transistor QP4.

Diode D1 is connected between VDD and node 210 More particularly, diode D1 in FIG. 2B is depicted as an NMOS transistor N7 whose gate and drain are connected to VDD and whose source is connected to node 210.

The operation of the circuitry of FIG. 2B will now be discussed.

In an active mode, namely when Vgg4 for DTMOS transistor QP4 is set low, then so is the voltage on node 212, which causes transistor QN5 to turn-off and transistor QP5 to turn-on. As a result, the voltage on node 208 is raised to about VDD. This causes transistor QP6 to turn-off and transistor QN6 to turn-on, which reduces the voltage at node 210 initially in proportion to decreases in Vgg (starting from $Vgg_4 \approx VDD$). The clipping effect of diode-configured transistor N7, however, places a lower bound on the voltage at node 210 while transistor QN6 is on and transistor QP6 is off, as follows.

$$V_{node210} = V_{QP4}^{bb} \approx VDD - V_{N7}^{threshold} \quad\quad\quad 11)$$

As such, Vbb is no longer effected by the degree to Vgg4 is reduced below above $V_{N7}^{threshold} = V_{D1}^{threshold}$.

In an non-active or sleep mode, namely when Vgg4 for DTMOS transistor QP4 is set high, e.g., $Vgg_{QP4} \approx VDD$, then so is the voltage on node 212, which causes transistor QN5 to turn-on and transistor QP5 to turn-off. As a result, the voltage on node 208 is reduced to $$V_{node208} \approx VSS + V_{QN5}^{threshold}{}_g \qquad 12)$$

This causes transistor QP6 to turn-on and transistor QN6 to turn-off, which reduces the voltage on node 210 to about VDD, namely.

$$V_{node210} = V_{QP4}^{bb} \approx VSS + V_{QN6}^{threshold}{}_g \qquad 13)$$

Of course, although several variances and example embodiments of the present invention are discussed herein, it is readily understood by those of ordinary skill in the art that various additional modifications may also be made to the present invention. Accordingly, the example embodiments discussed herein are not limiting of the present invention.

What is claimed:

1. A multi-threshold MOS (MTMOS) transistor arrangement comprising:
    a subject circuit including low threshold-voltage transistors for which leakage current is to be controlled; and
    a current cut-off (CCS) switch circuit including,
    an MOS transistor having a gate and a body and a terminal connected to a system ground voltage, and
    a governor circuit connected to the gate, the body, a system supply voltage and the system ground voltage for generating a body-bias voltage for the MOS transistor, and for varying a maximum magnitude of the body-bias voltage based on the magnitude of the gate voltage of the MOS transistor; wherein
        the maximum magnitude of the body bias voltage is varied such that the maximum magnitude is equal to one of the gate voltage of the MOS transistor and a first threshold voltage of the governor circuit,
    the first threshold voltage is less than the gate voltage of the MOS transistor, and
    the subject circuit and the CCS switch circuit are serially connected between the system-supply voltage and the system ground voltage.

2. The arrangement of claim 1, wherein the subject circuit is connected to the system-supply voltage and the CCS switch circuit is connected to the system ground voltage.

3. The arrangement of claim 1, wherein the MOS transistor is an n-type MOS transistor.

4. The arrangement of claim 3, wherein the CCS switch circuit further includes another n-type MOS transistor whose gate and drain are connected to the gate of the MOS transistor and whose source is connected to the body of the MOS transistor.

5. A multi-threshold MOS (MTMOS) transistor arrangement comprising:
    a subject circuit including low threshold-voltage transistors for which leakage current is to be controlled;
    a first cut-off (CCS) switch circuit including,
        a first MOS transistor having a first gate and a first body and a first terminal connected to a system ground voltage, and
        a first governor circuit connected to the first gate, the first body, a system supply voltage and the system ground voltage for generating a first body-bias voltage for the first MOS transistor and for varying a maximum magnitude of the first body-bias voltage based on the magnitude of the gate voltage of the first MOS transistor; wherein
            the maximum magnitude of the body bias voltage is varied such that the maximum magnitude is equal to one of the first gate voltage of the first MOS transistor and a first threshold voltage of the first governor circuit; and
    a second CCS switch circuit including,
        a second MOS transistor having a second gate and a second body and a second terminal connected to the system ground voltage, and
        a second governor circuit connected to the second gate, the second body, the system supply voltage and the system ground voltage for generating a second body-bias voltage for the second MOS transistor, and for varying a maximum magnitude of the second body-bias voltage based on the magnitude of the gate voltage of the second MOS transistor; wherein
            the maximum magnitude of the second body bias voltage is varied such that the maximum magnitude is equal to one of the second gate voltage of the second MOS transistor and a second threshold voltage of the second governor circuit,
    the first threshold voltage is greater than the first gate voltage of the first MOS transistor,
    the second threshold voltage is less than the second gate voltage of the second MOS transistor; and
    the first CCS switch circuit, the subject circuit and the second CCS switch circuit are serially connected between the system-supply voltage and the system ground voltage.

6. The arrangement of claim 5, wherein the first MOS transistor is a p-type MOS transistor and the second MOS transistor is an n-type MOS transistor.

7. The arrangement of claim 6, wherein the first CCS switch circuit is connected to the system-supply voltage and the second CCS switch circuit is connected to the system ground voltage.

8. The arrangement of claim 7, wherein the subject circuit is connected between the first CCS switch circuit and the second CCS switch circuit.

9. A multi-threshold MOS (MTMOS) transistor arrangement comprising:
    a subject circuit that includes low threshold-voltage transistors for which leakage current is to be controlled;
    a first cut-off (CCS) switch circuit that includes a first MOS transistor having a gate and a body, a magnitude of a body-bias voltage of the first MOS transistor being lower-bounded by a magnitude of a gate voltage of the first MOS transistor; and
    a second CCS switch circuit that includes a second MOS transistor having a gate and a body, a magnitude of a body-bias voltage of the second MOS transistor being upper-bounded by a magnitude of a gate voltage of the second MOS transistor; wherein
        the first CCS switch circuit, the subject circuit and the second CCS switch circuit are serially connected between a system-supply voltage and a system ground voltage, and the first CCS switch circuit further includes,
        another p-type MOS transistor whose gate and drain are connected to the system around voltage and the whose source is connected to the body of the first MOS transistor, and the second CCS switch circuit further includes,
        another n-type MOS transistor whose gate and drain are connected to the system-supply voltage and whose source is connected to the body of the second MOS transistor.

* * * * *